US007881058B2

(12) United States Patent
Römer et al.

(10) Patent No.: US 7,881,058 B2

(45) Date of Patent: Feb. 1, 2011

(54) COOLING SYSTEM FOR A ROTARY TABLET PRESS

(75) Inventors: Harald Römer, Reinbek (DE); Ingo Schmidt, Schwarzenbek (DE); Werner Seifert, Wentorf (DE); Peter Lüneburg, Berkenthin (DE)

(73) Assignee: Fette GmbH, Schwarzenbek (DE)

( * ) Notice: Subject to any disclaimer, the term of this patent is extended or adjusted under 35 U.S.C. 154(b) by 0 days.

(21) Appl. No.: 12/175,987

(22) Filed: Jul. 18, 2008

(65) Prior Publication Data

US 2009/0027854 A1 Jan. 29, 2009

(30) Foreign Application Priority Data

Jul. 24, 2007 (DE) ...................... 10 2007 034 360

(51) Int. Cl.
*H05K 7/20* (2006.01)
*B30B 11/08* (2006.01)
*H02K 9/19* (2006.01)

(52) U.S. Cl. ....................... 361/698; 361/694; 361/695; 361/696; 361/699; 361/700; 310/54; 310/58; 310/64; 425/345; 62/259.2

(58) Field of Classification Search ......... 361/676–678, 361/688–690, 692, 694–696, 698, 701, 704; 165/80.3–80.5, 104.33, 185; 62/181–185, 62/201, 507–508, 515, 518–519; 310/54, 310/57–58, 64, 254.1, 261.1; 425/345, 353
See application file for complete search history.

(56) References Cited

U.S. PATENT DOCUMENTS

| | | | | |
|---|---|---|---|---|
| 4,257,239 | A * | 3/1981 | Partin et al. | 62/238.7 |
| 4,601,866 | A * | 7/1986 | David et al. | 264/109 |
| 4,800,729 | A * | 1/1989 | Hara | 62/185 |
| 5,706,668 | A * | 1/1998 | Hilpert | 62/259.2 |
| 6,003,319 | A * | 12/1999 | Gilley et al. | 62/3.7 |
| 6,170,270 | B1 * | 1/2001 | Arshansky et al. | 62/81 |
| 6,467,280 | B2 * | 10/2002 | Pham et al. | 62/126 |
| 7,024,573 | B2 * | 4/2006 | Patel et al. | 713/324 |
| 7,158,378 | B2 * | 1/2007 | Hinzpeter et al. | 361/695 |
| 7,266,970 | B2 * | 9/2007 | Li | 62/310 |
| 7,364,420 | B2 * | 4/2008 | Luneburg et al. | 425/345 |
| 2005/0126766 | A1 * | 6/2005 | Lee et al. | 165/133 |
| 2006/0157878 | A1 * | 7/2006 | Brisset et al. | 264/39 |

FOREIGN PATENT DOCUMENTS

| | | | |
|---|---|---|---|
| DE | 103 21 022 A1 | | 9/2004 |
| DE | 10 2004 040 163 B3 | | 4/2006 |
| JP | 2000301393 A | * | 10/2000 |

* cited by examiner

*Primary Examiner*—Robert J Hoffberg
(74) *Attorney, Agent, or Firm*—Vidas, Arrett & Steinkraus

(57) ABSTRACT

A cooling system for a rotary tablet press with which a rotor is driven by an electrical drive motor and the rotor and drive motor are arranged in a closed housing, and a control cabinet for the drive motor and further units in the housing, wherein arranged within the housing is a cooling machine whose evaporator is part of a first heat exchanger, whose other part is arranged in a coolant circuit for the drive motor, a fan is arranged in a channel in the housing closed relative to the housing interior, where the fan draws cool air in via an air inlet of the housing and gives it off via an air outlet of the housing, wherein the cool air is engaged in heat exchange with a condenser of the cooling machine.

10 Claims, 5 Drawing Sheets

COOLING SYSTEM FOR A ROTARY TABLET PRESS

CROSS-REFERENCE TO RELATED APPLICATIONS

Not applicable.

STATEMENT REGARDING FEDERALLY SPONSORED RESEARCH

Not applicable.

BACKGROUND OF THE INVENTION

A system for producing tablets along with the customary rotary press includes additional parts and peripheral units. The essential electrical and electronic components and components for the control of the main drive of the press and the servo drives in the press are located together in a control cabinet, which is connected to the tablet press via a cable.

The electrical components, in particular, the power units and the machine computer heat up during operation, and it is necessary to provide sufficient cooling in order to limit the heating. The heating of these parts, naturally, also heats up the operating area of the entire system; the lower the thermal loss in the control cabinet is kept and the more effectively the heat dissipation from the control cabinet occurs, the higher the ambient temperature can be. Thus, the availability of the entire system increases with the control of the thermal loss.

From DE 103 21 022 B4, the entire contents of which is incorporated herein by reference, the control cabinet for a tablet press is known that is attached to the lower portion of the press housing. A ventilation channel, whose inner wall is formed by a housing wall section, is located on the exterior of the closed control cabinet. Assigned to the ventilation channel is a fan, which feeds external air through at least one inlet into the ventilation channel, wherein the air escapes through at least one outlet. A second fan, which circulates the air in the interior of the housing, is arranged in the interior of the control cabinet housing such that the air strikes at least partially along the inner side of the housing wall that delimits the ventilation channel.

From DE 10 2004 040 163 A1, the entire contents of which is incorporated herein by reference, a rotary tablet press is known, in which the runner of an electrical drive motor is arranged on the rotor shaft in a torque-proof manner. The runner is arranged directly below the rotor on the rotor shaft. From the state of the art, it is further known to integrate the runner of the drive motor into the press rotor, wherein the runner surrounds the stator. Both drive arrangements have the advantage that an extraordinarily compact construction can be attained. Due to the fact that the motor is arranged relatively close to the dies in the die plate, the heat generated in the motor is also transferred onto the die plate. However, it is normally required that the die plate in the area of the dies must not exceed a maximum temperature, which is relatively low.

The objective of the invention is to create a cooling system for a rotary tablet press, which enables an effective cooling also for an electrical drive motor mounted near the rotor.

BRIEF SUMMARY OF THE INVENTION

With the cooling system according to the invention, within the housing, a refrigerating unit is arranged, whose evaporator is a part of a first heat exchanger, whose other part is arranged in a coolant circuit for the drive motor. In a channel within the housing, a fan is arranged which draws in cooling air via an air intake and gives off the air via an air outlet in the housing, wherein the cooling air is engaged in heat exchange with the condenser of the refrigerating unit.

Using the measure according to the invention, the heat from the drive motor can be removed effectively, so that an undesired heating of the die plate does not occur. The invention enables cooling by means that are arranged in the interior of the housing. Fans attached to the exterior or flange-mounted cooling units are not necessary.

According to an embodiment of the invention, water is provided as a coolant in the cooling circuit.

According to another embodiment of the invention, the intake is arranged in the bottom of the housing, and the air outlet is arranged in the top of the housing. These openings preferably lie near a side wall of the housing.

The cooling system according to the invention is especially advantageous with a drive motor integrated in the rotor, where the runner is connected to the rotor in a torque proof manner, and the stator lies in the interior of the runner. The coolant lines can then be simply connected to the cooling system in the stator of the electric motor.

The condenser of the refrigerating unit for the cooling system according to the invention is cooled with room air. Therefore, an embodiment of the invention provides that the condenser/heat exchanger is arranged in the upper region of the housing, and the fan is arranged on the up-stream side of the condenser/heat exchanger. Thus, the refrigerating unit is arranged in relatively elongated arrangement near a side wall of the housing, and therefore, is housed in a space-saving manner.

According to a further embodiment of the invention, the channel areas through which room air passes, preferably have a so-called nano-coating. This prevents the deposition of impurities on the channel walls, so that cleaning measures or similar can be eliminated.

According to a further embodiment of the invention, a second heat exchanger, through which the coolant flows, is arranged in the housing, and a second fan generates a cool air stream across the second heat exchanger, which e.g., is directed into the housing, in order to sufficiently cool the housing atmosphere and with it the parts of the tablet press. It is also conceivable to attach the second heat exchanger to the wall of a control cabinet outside of the press housing, wherein naturally, the coolant lines must be led to the outside as well.

According to the invention, it is especially advantageous if the control cabinet is also arranged below the rotor in the housing. Because according to the invention, the drive motor is arranged closely below the rotor or in the rotor itself, sufficient space is available for the placement of the control cabinet at the lower end of the housing. Because the control cabinet and also the parts held by it are to be cooled, according to an embodiment of the invention, the cool air stream of the second fan flows through the inside of the control cabinet.

According to a further embodiment of the invention, the rotor with the drive can be arranged within a process housing, closed relative to the housing, into which and out of which the coolant lines are led.

Finally, according to a further embodiment of the invention the refrigerating unit can be assigned a temperature control device, which is connected to a temperature sensor in or on the rotor, and/or a sensor in the housing. Thus, the heat in the rotary press can be controlled and led away in a controlled manner. The cooling system is integrated into the tablet press and does not require any external devices, or fans attached to the housing, flange-mounted devices, or similar. If placed on the bottom and the top of the housing, the air openings remain out of sight.

With the invention, a heating of the die plate is prevented wherein the temperature ranges can be adjusted via the user interface at an operator computer. The cool air for the refrigerating unit is separated from the air within the housing. The cooling of the drive motor and with it also the cooling of the die plate on the one hand, and the process space on the other, occurs with the coolant of the same circuit. The temperature of the coolant can be preselected, as mentioned, by control of the refrigerating unit. The heat dissipation occurs via a heat exchanger to the ambient air.

It is advantageous with the cooling system according to the invention that the waste heat is ready in condensed form for leading off, and is at a low entropy level. Because additional devices are not needed, no additional connection lines are necessary, whereby minimal space is required. Nonetheless, the possibility exists to service and clean the parts of the cooling system according to the invention via maintenance openings in the housing.

When a tablet press is mentioned in the preceding and below, it refers to general rotary presses for producing preforms from powdered material.

BRIEF DESCRIPTION OF THE SEVERAL VIEWS OF THE INVENTION

An exemplary embodiment of the invention is explained in the following in more detail using the drawings.

FIG. 1 schematically shows the layout of a cooling system according to the invention in the housing of a tablet press.

DETAILED DESCRIPTION OF THE INVENTION

Figure 1:
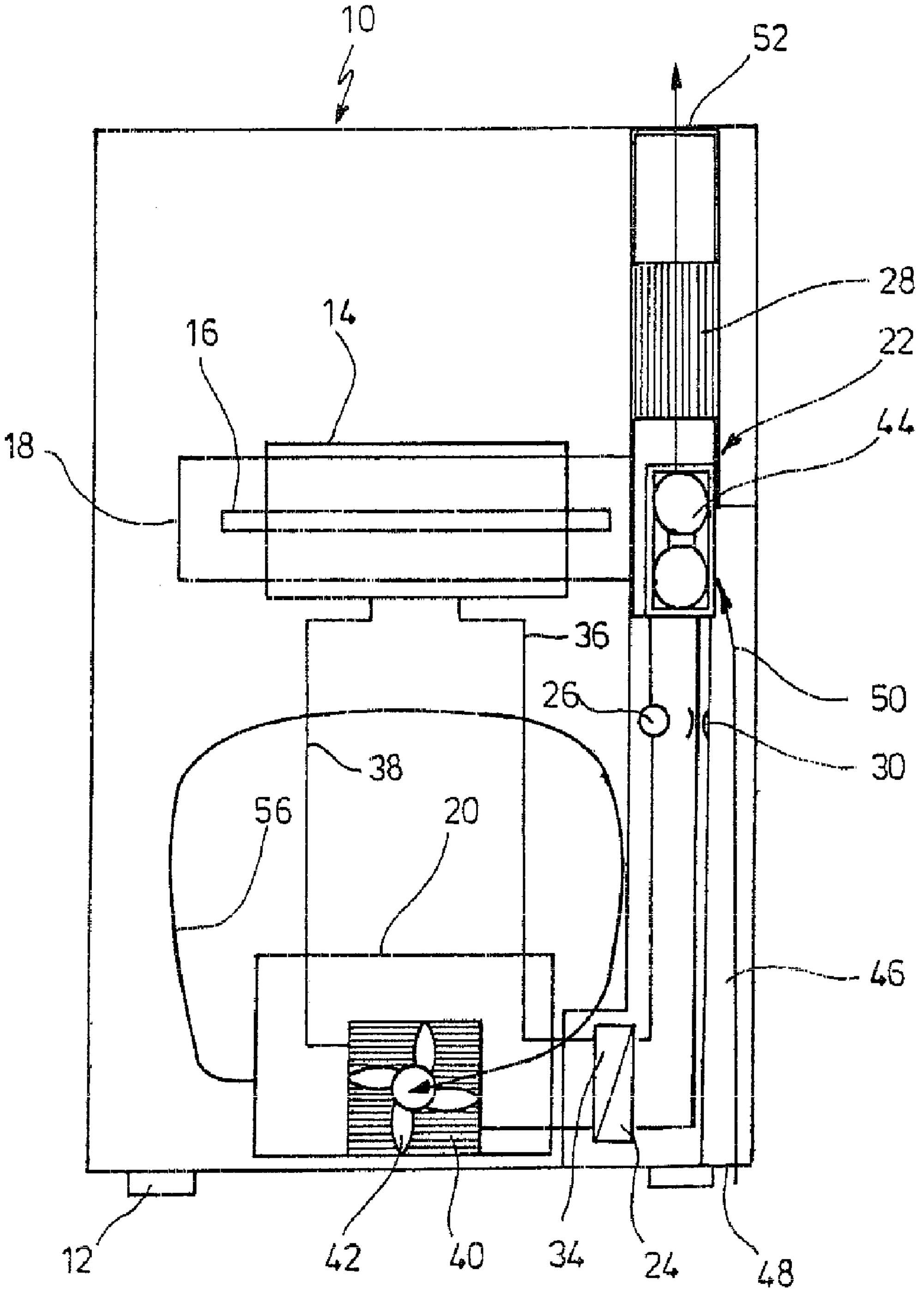

While this invention may be embodied in many different forms, there are described in detail herein a specific preferred embodiment of the invention. This description is an exemplification of the principles of the invention and is not intended to limit the invention to the particular embodiment illustrated A cuboid housing 10 for a rotary tablet press is indicated in FIG. 1. It rests on feet 12 and thus, is somewhat above the ground. In the housing 10, a rotor 14 with die plate 16 of a rotary press, not represented further, is indicated that is mounted in a suitable machine frame (not shown). Parts of the rotor project above and below of a process housing 18, which houses the process space of the press, so that production dust does not reach the outside. It is understood that an appropriate sealing is provided above and below.

The drive motor is integrated in the rotor 14, as is disclosed in DE 10 2004 040 163 A1. The stator of the motor also projects above and below of the process housing 18.

A control cabinet 20, arranged on the bottom of the housing 10, contains all electrical and electronic components including a machine computer for the operation of the double rotary press. These parts are known and therefore, should not be further listed.

A refrigerating unit is housed in an elongated housing 22, extending from the bottom to the top of the housing 10. It has an evaporator 24, a compressor 26, a condenser 28 and an air regulator 30. These are the customary parts of a compression refrigerant circuit, as it is generally known. The evaporator 24 is part of a heat exchanger, whose other part 34 forms section of a coolant circuit. The coolant circuit is composed of a cooling system of the stator of the motor, not shown, which is connected via the lines 36 and 38 to the heat exchanger part 34 and a further heat exchanger 40. The heat exchanger 40 is attached to the outer wall of the control cabinet 20, where it is assigned a fan 42.

A further fan 44, located in the housing 22, draws in air through a lower inlet 48 via a channel 46. The channel 46 is formed between the housing 22 and the associated housing wall. The air flow 50 drawn in by the fan 44 reaches an upper outlet 52 via the condenser 28 of the refrigerating unit. Consequently, the cooling of the condenser 28 occurs by means of room air.

The cooling of the drive motor (not shown) and the die plate 16 occurs with a coolant, which is preferably water, in the described coolant circuit. The coolant flows—possibly supported by a pump—through the heat exchanger 40, and the fan 42 generates an air flow 56 within the housing 10, which air flow is also cooled by the heat exchanger 40, and therefore, cools the atmosphere in the housing 10 and with it the process housing 18.

Figure 2:
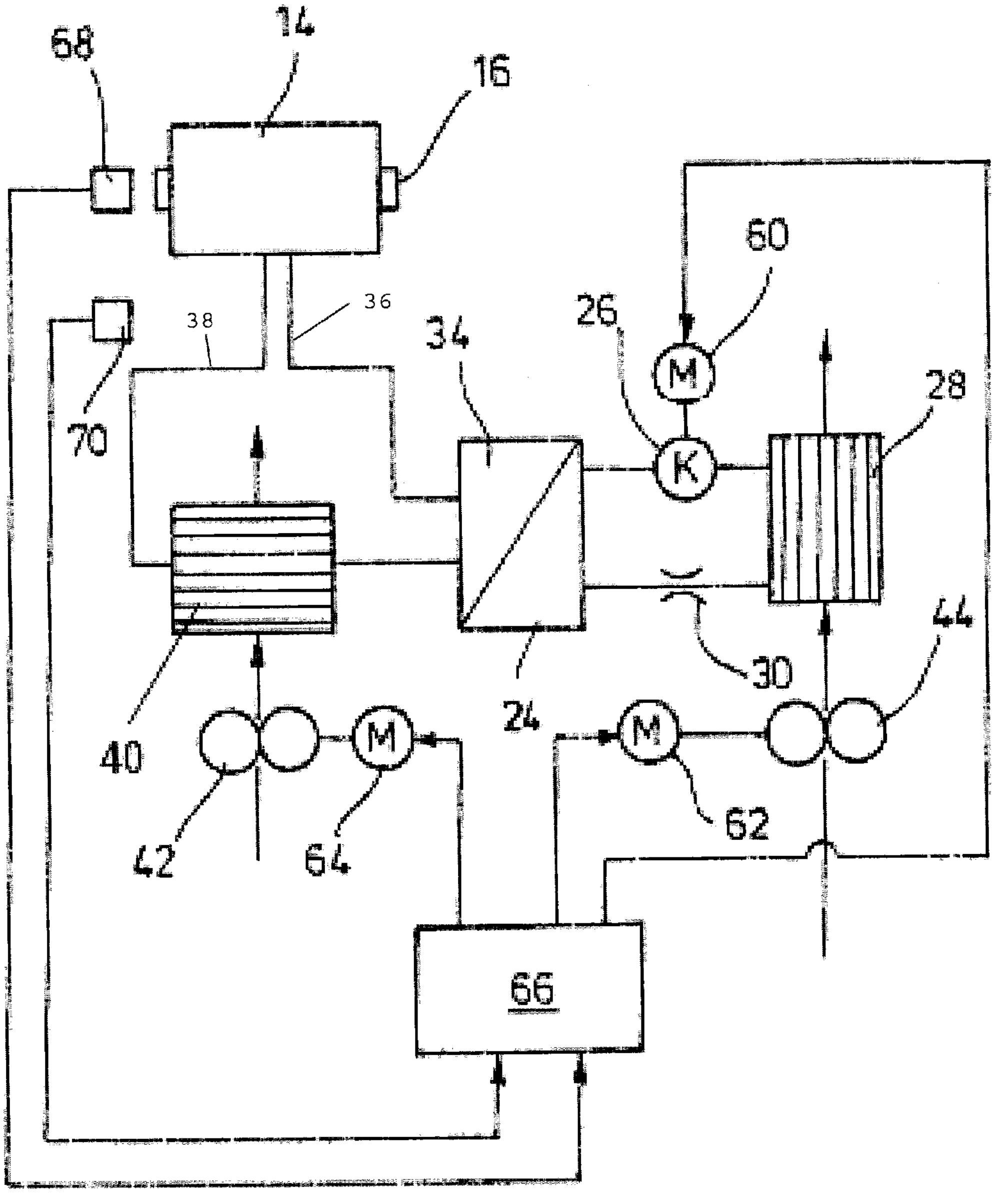
FIG. 2 shows the block circuit diagram of the cooling system according to FIG. 1.

In the block diagram according to FIG. 2, the same parts as already shown in FIG. 1, are provided with the same reference numbers. Additionally represented are the drive motors 60, 62, and 64, for the compressor 26, and the fans 44 and 42. They are controlled by a controller 66, which is connected to sensors 68 and 70. The sensor 68 measures the temperature in the area of the die plate 16 and within the rotor 14. The sensor 70 measures the temperature within the housing 10 or the process housing 18. The controller 66 is connected to an operator computer, not shown, for example, via a radio link. In a suitable manner, a set-point for the temperature of the die plate or in the housings 10 and 18 is preset in the controller 66. Through a suitable control of the refrigerating unit and the fans 42, 44 it is ensured that the set temperature is reached and held.

Figure 3:
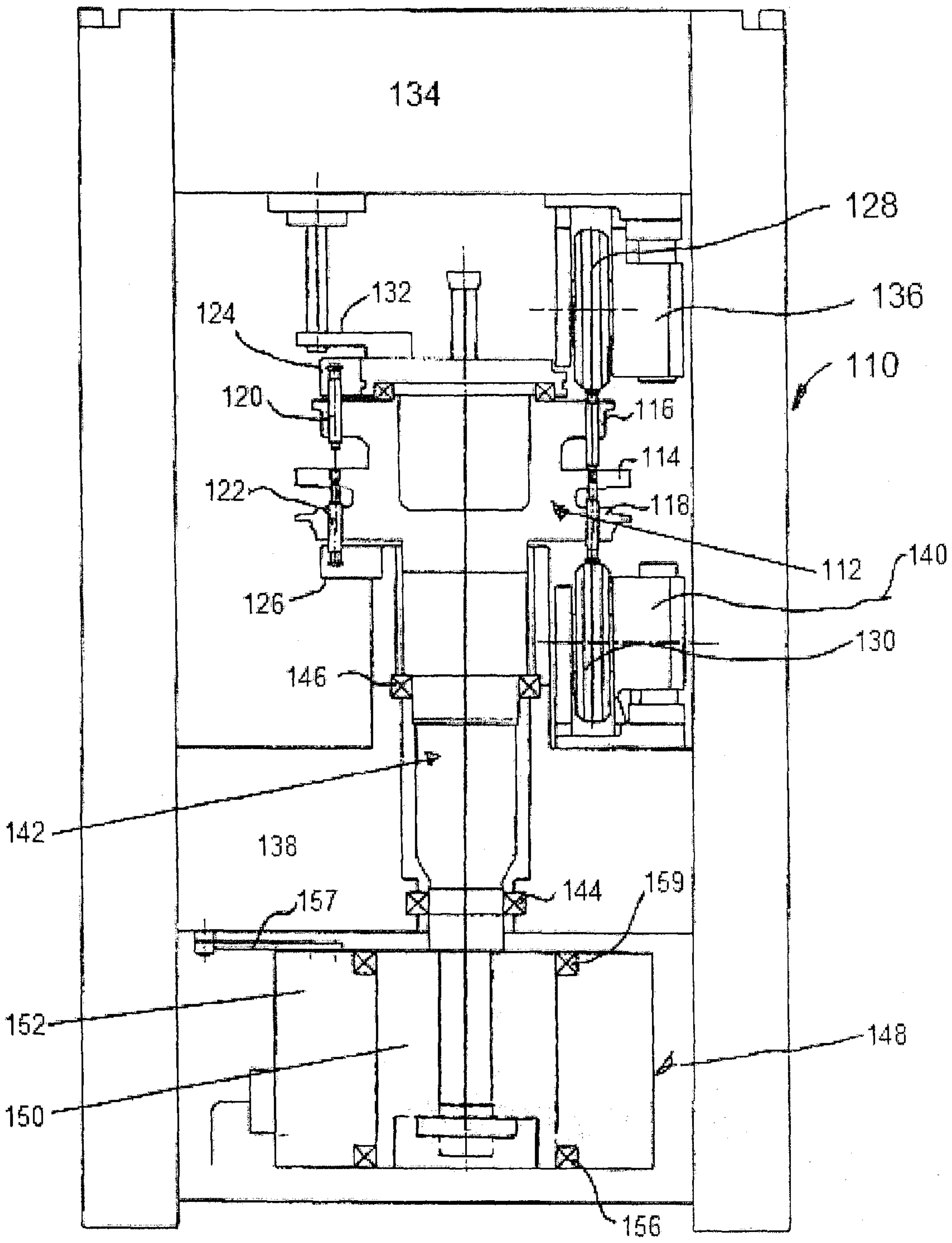
FIG. 3 shows a schematic section of a round runner tablet press with a drive.

FIG. 3 a machine frame is labeled with 110. It is used to carry a rotary press for making tablets. The latter exhibits a rotor 112, which, as usual, consists of a die plate 114, upper guide 116 for punches and lower guide 118 for punches. The named parts form a unit. The guides 116, 118 take upper punches 120 or lower punches 122, respectively, and guide these axially. They work together with non-labeled dies of die plate 114. The control of the upper and the lower punches 120, 122 is carried out by cam segments 124 or 126, respectively. Furthermore, an upper pressure roller 128 and a lower pressure roller 130 can be seen which are used to compress the powder material in the die by pressing upper and lower punches 120, 122 towards each other. As can be seen, the upper cam segments 124 are carried by an upper traverse 134 of frame 110 by means of respective retaining means 132. A bearing part 136 for the upper pressure roller 128 is also mounted to the traverse 134. The lower cam segments 126 are mounted in a lower traverse 138 of frame 110, to which traverse also a retaining portion 140 for the lower pressure roller 130 is fixed. The lower traverse 138 also bears the rotor shaft 142, namely by a lower antifriction bearing 144 and an upper antifriction bearing 146. The rotor shaft 142 is coupled with the rotor 112 in a suitable way not shown.

An electric drive motor 148, for instance a so-called torque motor, is fixed to the rotor shaft 142 below the traverse 138. Its runner 150 is placed on a lower, dashed segment of rotor shaft 142 in a torque proof manner. The runner 150 rotates in the stator 152 by means of an upper antifriction bearing 159 and a lower antifriction bearing 156. The torque at stator 152 is absorbed by means of a torque plate 157.

Figure 4:
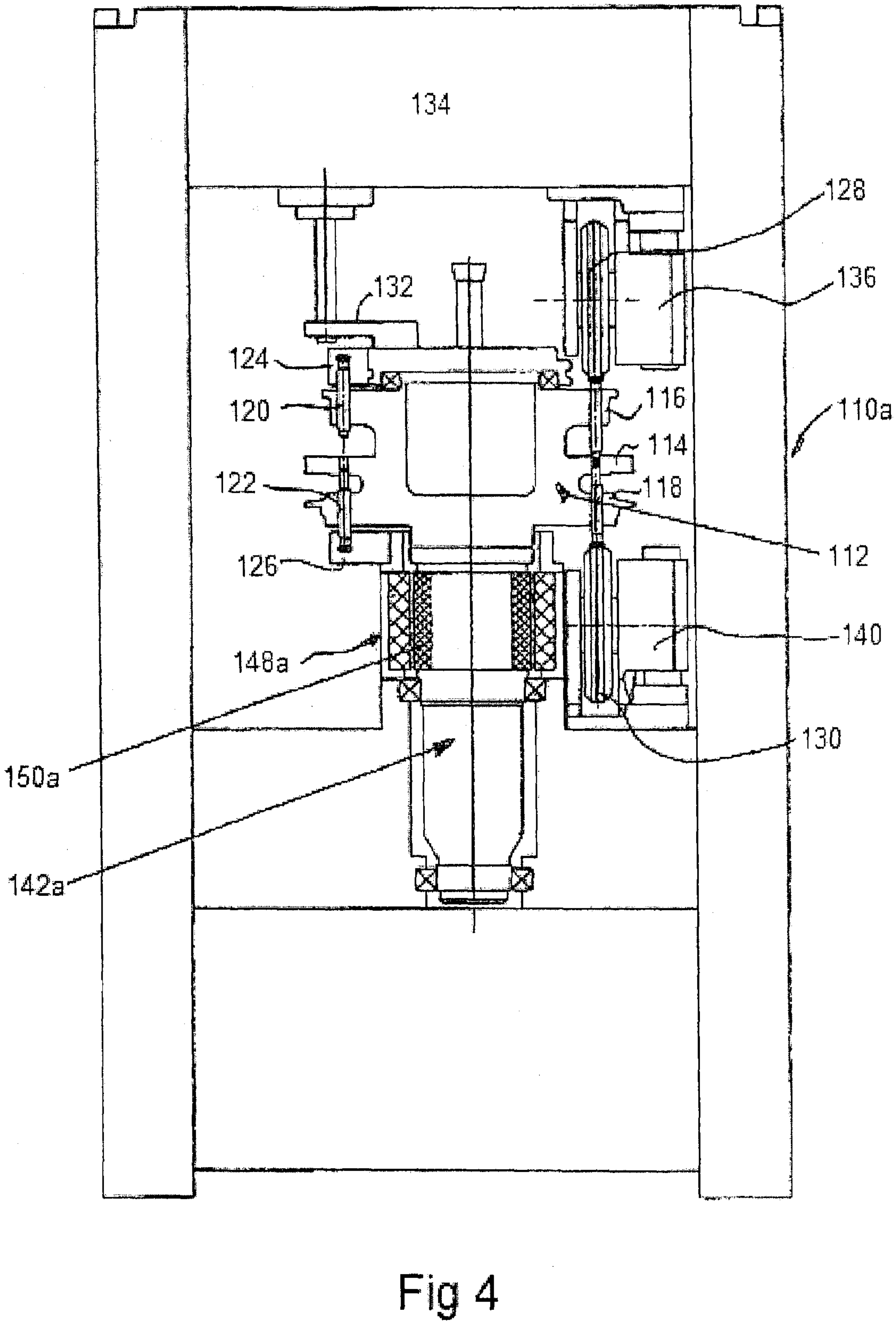
FIG. 4 shows another embodiment of a drive in a round runner tablet press.

As far as the same parts are taken in the embodiment according to FIG. 4 as in the embodiment according to FIG. 3, the same labels are used. The embodiment according to FIG. 4 is distinguished from that according to FIG. 3 in that the rotor shaft 142*a* is significantly shorter and below the rotor shaft 142*a*, a free space remains in frame 110*a*. The electric drive motor 148*a* is placed immediately below the rotor 112, and the runner 150*a* seats on a section of the rotor shaft 142*a* with reduced diameter. One sees that in this embodiment the achievable saving of space is considerable. The remainder of the parts of the embodiment according to FIG. 4 are composed and mounted similarly as it has been described in connection with FIG. 3.

In the embodiment according to FIG. 5, again the same parts are labeled with the same labels as in the embodiments according to FIGS. 3 and 4.

Figure 5:
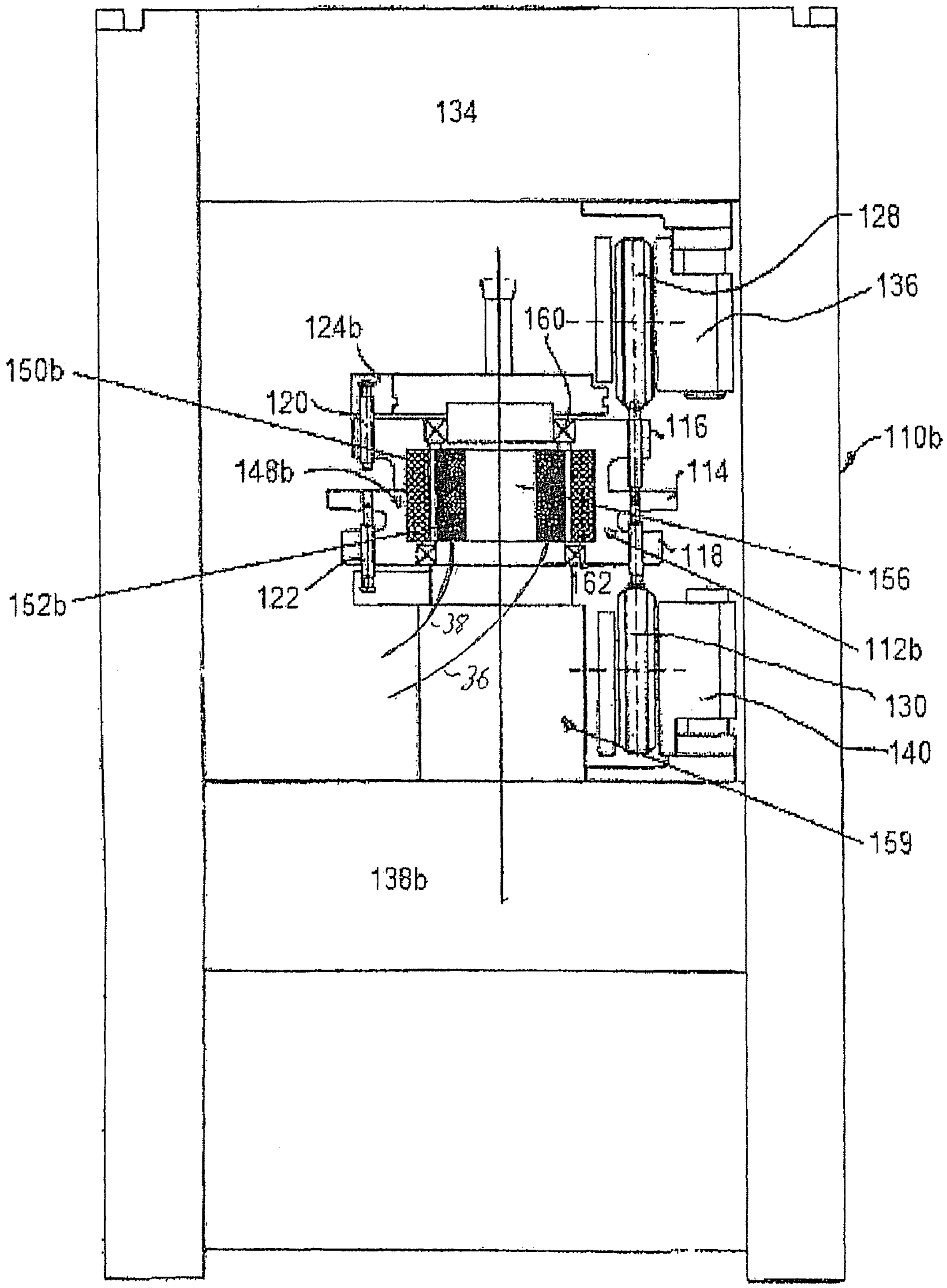
FIG. 5 shows yet another embodiment of a drive in a round runner tablet press.

The embodiment according to FIG. 5 is distinguished from those according to FIGS. 3 and 4 in that on the traverse 138*b* of the frame 110*b*, a vertical supporting post is disposed in a stationary manner. The post exhibits a section with reduced diameter at an upper end which is labeled with 156, and it is disposed on the stator 152*b* of an electric drive motor 148*b* in a stationary manner, while its runner 150*b* is integrated in the rotor 112*b*. For mounting of the runner 150*b*, the rotor 112*b* can be divided in a horizontal plane or, alternatively, it can be composed of two or more segments in circumferential direction, which are combinable fittingly and firmly, but detachably. The rotor 112*b* is supported rotatably on the supporting post 159 by means of an upper antifriction bearing 160 and a lower antifriction bearing 162. As can be seen, the upper cam segments 124*b* are also fixed to the upper end of the supporting post 159. The lower pressure roller 130 is, on the one hand, supported in the bearing element 140, which is mounted on the traverse 138*b*, and on the other hand it is supported at the supporting post 159.

In the embodiment according to FIG. 5, one can see the large economy of space which is achieved in this construction.

The above disclosure is intended to be illustrative and not exhaustive. This description will suggest many variations and alternatives to one of ordinary skill in this art. All these alternatives and variations are intended to be included within the scope of the claims where the term "comprising" means "including, but not limited to". Those familiar with the art may recognize other equivalents to the specific embodiments described herein which equivalents are also intended to be encompassed by the claims.

Further, the particular features presented in the dependent claims can be combined with each other in other manners within the scope of the invention such that the invention should be recognized as also specifically directed to other embodiments having any other possible combination of the features of the dependent claims. For instance, for purposes of claim publication, any dependent claim which follows should be taken as alternatively written in a multiple dependent form from all prior claims which possess all antecedents referenced in such dependent claim if such multiple dependent format is an accepted format within the jurisdiction (e.g. each claim depending directly from claim 1 should be alternatively taken as depending from all previous claims). In jurisdictions where multiple dependent claim formats are restricted, the following dependent claims should each be also taken as alternatively written in each singly dependent claim format which creates a dependency from a prior antecedent-possessing claim other than the specific claim listed in such dependent claim below.

This completes the description of the preferred and alternate embodiments of the invention. Those skilled in the art may recognize other equivalents to the specific embodiment described herein which equivalents are intended to be encompassed by the claims attached hereto.

What is claimed is:

1. A cooling system for a rotary tablet press in which a rotor is driven by an electrical driving motor, the rotor and electrical driving motor are located in a closed housing, a control cabinet for electrical components being also enclosed by the closed housing, characterized in that a cooling machine is located within the closed housing, the cooling machine comprising a vaporizer (24), and a condenser (28), a vaporizer (24) of the cooling machine being a first part of a first heat exchanger, a second part (34) of the first heat exchanger being located in a cooling circuit for the electrical driving motor, the cooling circuit having a coolant, a first fan (44) is arranged in a channel being located in a passage (22) in the closed housing (10), the channel closed relative to a first remainder portion of the closed housing (10), the first fan received cooling air through an air entrance opening (48) of the closed housing (10), and transmits the cooling air through an air exit opening (52) of the closed housing (10), the cooling air being in heat exchange relationship with the condenser (28) of the cooling machine, the cooling circuit runs via an inner lying motor stator of the electrical driving motor integrated into the rotor (14), wherein a runner is connected to the rotor (14).

2. The cooling system according to claim 1, characterized in that water is provided as the coolant.

3. The cooling system according to claim 1, characterized in that the air entrance opening (48) is arranged in the bottom of the closed housing (10), and the air exit opening (52) is arranged in the top of the closed housing (10).

4. The cooling system according to claim 3, further comprising the air entrance opening (48) and the air exit opening (52) are proximate to a side wall of the closed housing.

5. The cooling system according to claim 4, characterized in at least one of the control cabinet (20) arranged below the rotor (14) in the closed housing (10), and a cool air flow of a second fan (42) flows through the interior of the control cabinet (20).

6. The cooling system according to claim 4, characterized in that the rotor (14) with the electrical driving motor are arranged essentially sealed within a process housing (18) closed relative a second remainder portion of the to the closed housing (10), wherein coolant lines (36, 38) are led into and out of the inner lying motor stator of the electrical driving motor.

7. The cooling system according to claim 1, characterized in that the condenser (28) is arranged in the upper area of the housing (10), and the first fan (44) is arranged on the upstream side of the condenser (28).

8. The cooling system according to claim 1, characterized in that the channel and a part of the condenser (28) struck by the cool air have a nano-coating.

9. The cooling system according to claim 1, characterized in that a further heat exchanger (40) is arranged in the closed housing (10) through which the coolant flows, and to which is assigned a second fan (42) which creates a cool air flow in the closed housing (10).

10. The cooling system according to claim 1, characterized in that a temperature controller (66) is assigned to the cooling machine, which is connected to at least one of a temperature sensor (68) in or on the rotor (14), and a sensor (70) in the closed housing (10).

* * * * *